United States Patent
Kawasaki

(10) Patent No.: US 7,301,184 B2
(45) Date of Patent: Nov. 27, 2007

(54) SOLID STATE IMAGE SENSOR HAVING PLANARIZED STRUCTURE UNDER LIGHT SHIELDING METAL LAYER

(75) Inventor: Toru Kawasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/657,236

(22) Filed: Sep. 9, 2003

(65) Prior Publication Data

US 2004/0051124 A1 Mar. 18, 2004

(30) Foreign Application Priority Data

Sep. 9, 2002 (JP) ............................. 2002-262637

(51) Int. Cl.
*H01L 27/148* (2006.01)
(52) U.S. Cl. ...................................... 257/249; 257/215
(58) Field of Classification Search ........ 257/214–251, 257/413
See application file for complete search history.

(56) References Cited

U.S. PATENT DOCUMENTS 6,013,925 A * 1/2000 Ogawa ....................... 257/232
6,143,585 A * 11/2000 Hatano et al. ................. 438/69
6,452,243 B1 * 9/2002 Hatano et al. ............... 257/448
6,580,105 B1 * 6/2003 Hatano et al. ............... 257/222

FOREIGN PATENT DOCUMENTS

| JP | 05-29598 | | 2/1993 |
| JP | 07176714 A | * | 7/1995 |
| JP | 2571011 | | 10/1996 |
| JP | 2000183324 A | * | 6/2000 |
| JP | 2000196060 A | * | 7/2000 |

* cited by examiner

*Primary Examiner*—Sara Crane
(74) *Attorney, Agent, or Firm*—Young & Thompson

(57) ABSTRACT

Shift register electrodes are formed in an imaging area and a peripheral area through use of a single layer of conductive film, and a thick insulating film is deposited over those electrodes and planarized. The thick insulating film overlying the shift register electrodes in the peripheral area is kept as it is and on the other hand, the thick insulating film overlying the shift register electrodes is etched to just fill gaps between the shift register electrodes with the film, thereby allowing a light shielding metal layer overlying the shift register electrodes in the peripheral area and insulating films sandwiched therebetween to be formed without discontinuity. Since metal interconnect lines in the peripheral area have a thick and planarized insulating film formed thereunder, parasitic capacitance between diffusion layers/electrodes and the metal interconnect lines can be reduced, leading to reduction in power consumption of image sensor.

11 Claims, 30 Drawing Sheets

SOLID STATE IMAGE SENSOR HAVING PLANARIZED STRUCTURE UNDER LIGHT SHIELDING METAL LAYER

BACKGROUND OF THE INVENTION

1. Field of the Invention

The present invention relates to a solid state image sensor, and particularly to a solid state image sensor having a planarized structure under a light shielding metal layer.

2. Description of the Related Art

A solid state image sensor having shift register electrodes formed from a single conductive film has conventionally been manufactured using the following method. FIGS. 1A-C through 4A-C are cross sectional views illustrating the solid state image sensor that has shift register electrodes formed from a single layer of conductive film and is manufactured using a conventional method, in the order of manufacturing steps, in which signs A, B, C correspond to a photoelectric conversion region, a vertical shift register region, a peripheral area, respectively (for example, refer to Japanese Patent No. 2571011). Note that process steps performed before formation of shift register electrodes are not shown in FIGS. 1A-C through 4A-C.

First, an N-type semiconductor substrate 801 is thermally oxidized to form a gate oxide film 802 on the substrate on which a field isolation dielectric 852 is previously and selectively formed. In this case, the field isolation dielectric 852 corresponds to a peripheral area that surrounds an imaging area on which the gate oxide film 802 is formed. That is, the field isolation dielectric 852 is formed so as to surround the gate oxide film 802. It should be noted that this relationship between a set of imaging area and gate oxide film and a set of peripheral area and field isolation dielectric is maintained throughout this specification. Then, a conductive film 803 is deposited over the substrate 801 using low-pressure CVD. Thereafter, separation regions 804 (electrode separation gaps between electrodes) are formed in the conductive film 803 in the imaging area to form shift register electrodes 828 (including vertical and horizontal shift register electrodes) and separation regions 835 are formed in the conductive film 803, in the peripheral area to form shift register electrodes 830 (refer to FIGS. 1A-C).

It should be noted that the width of a gap between the shift register electrodes 828 in the imaging area is determined to be in the range of about 0.25 µm to about 0.5 µm in order to facilitate the transfer of electric charges within a shift register channel (including vertical and horizontal shift register channels). Furthermore, the separation regions 835 are formed between the shift register electrodes 830 in the peripheral area to have a width (e.g., 0.8 µm) longer than the gap between the shift register electrodes 828 in the imaging area in order to prevent a short between the shift register electrodes 830 in the peripheral area, which short is potentially caused around a step portion created by the boundary between the gate oxide film 802 and the field isolation dielectric 852.

Subsequently, a portion, located on a later-formed photoelectric conversion element, of the conductive film 803 that is provided to transfer electric charges and serves also as a readout gate is etched away using a photoresist 833 to form an opening in the conductive film 803 and then dopant ions are implanted through the opening to form a photoelectric conversion element (refer to FIGS. 2A-C).

Thereafter, the photoresist 833 is removed and an interlayer insulation film 806 is formed over the entire structure (refer to FIGS. 3A-C).

Then, a light shielding metal layer 807 is formed on a portion, excluding the photoelectric conversion element, of the interlayer insulation film 806 and metal interconnect lines 808 are formed on the interlayer insulation film 806 in the peripheral area (refer to FIGS. 4A-C).

It should be appreciated that the light shielding metal layer 807 and the metal interconnect lines 808 are simultaneously formed by processing a metal film at the same level.

However, as shown in FIGS. 4B, 4C, the solid state image sensor manufactured using the conventional method is constructed such that particularly, an extremely small spacing is created between the shift register electrodes 830 in the peripheral area after deposition of the interlayer insulation film 806, and therefore, formation of the metal interconnect lines 808 in the peripheral area potentially results in an open circuit 809 due to poor step coverage of the associated metal films over an underlying step, unfavorably causing the image sensor to have deteriorated charge transfer ability. Moreover, when the interlayer insulation film 806 interposed between the metal interconnect lines 808 and diffusion layers, polysilicon electrodes in the peripheral area is thin, parasitic capacitance therebetween becomes large and then causes increase in power consumption of image sensor.

Furthermore, in connection with how such an open circuit condition is prevented from occurring particularly in the metal interconnect lines 808, the idea may occur that the entire surface of the N-type semiconductor substrate 801 is planarized before formation of the metal film 807. However, as shown in FIG. 5, a photoelectric conversion element 919 is also covered with a planarized interlayer insulation film 906 and therefore, a distance "H" between the light shielding metal layer 907 and the surface of the photoelectric conversion element 919 becomes large. Accordingly, light 910 incoming from a direction inclined relative to the normal to the surface of the photoelectric conversion element easily enters a shift register channel 913 underneath a vertical shift register electrode 928, causing the image sensor to have poorer smear characteristics.

SUMMARY OF THE INVENTION

An object of the present invention is to provide a solid state image sensor configured to include metal interconnect lines free from discontinuity and have improved smear characteristics.

A solid state image sensor according to the present invention is fundamentally configured to include: a semiconductor substrate having an imaging area and a peripheral area surrounding the imaging area; a field isolation dielectric formed on the peripheral area to define the imaging area; a plurality of photoelectric conversion elements formed in the imaging area, each of the photoelectric conversion elements having an insulating film formed on an associated part of the imaging area; a charge transfer section provided in the imaging area to transfer charges generated by the photoelectric conversion elements, the charge transfer section having a plurality of shift register electrodes, each of shift register electrodes being elongated over the field isolation dielectric to form an elongated portion; an interlayer insulation film covering the elongated portion of the each of the shift register electrodes so that the interlayer insulation film in the peripheral area is thicker than the insulating film of each of the photoelectric conversion elements; and a conductive layer formed on the interlayer insulation film to cross the elongated portion of the each of the shift register electrodes.

A solid state image sensor according to the invention can be configured in detail to include: a semiconductor substrate having an imaging area and a peripheral area defined thereon so that the peripheral area surrounds the imaging area; a field isolation dielectric formed as isolation regions on the substrate in the peripheral area; a gate insulating film formed on the substrate in the imaging area and surrounded by the field isolation dielectric; a plurality of shift register electrodes formed on the gate insulating film in the imaging area and on the field isolation dielectric in the peripheral area; photoelectric conversion elements formed in the substrate in the imaging area, each element being surrounded by the shift register electrode; and an interlayer insulation film having a planarized surface and covering the plurality of shift register electrodes, as well as gaps between the plurality of shift register electrodes, the interlayer insulation film being formed on the gate insulating film on each of the photoelectric conversion elements and formed lower than the shift register electrode surrounding each of the photoelectric conversion elements.

A solid state image sensor according to the invention can be configured in more detail to include: a semiconductor substrate having an imaging area and a peripheral area defined thereon so that the peripheral area surrounds the imaging area; a field isolation dielectric formed as isolation regions on the substrate in the peripheral area; a gate insulating film formed on the substrate in the imaging area and surrounded by the field isolation dielectric; a plurality of vertical and horizontal shift register electrodes (referred to generally as shift register electrodes) formed on the gate insulating film in the imaging area and on the field isolation dielectric in the peripheral area, the plurality of vertical and horizontal shift register electrodes being made from a single layer of conductor; photoelectric conversion elements formed in the substrate, each element being surrounded by the vertical shift register electrode; an interlayer insulation film having a planarized surface and covering the plurality of vertical and horizontal shift register electrodes, as well as gaps between the plurality of vertical and horizontal shift register electrodes, the interlayer insulation film being formed on the gate insulating film on each of the photoelectric conversion elements and formed lower than the vertical shift register electrode on each of the photoelectric conversion elements; and a light shielding metal layer provided on the interlayer insulation film on the plurality of vertical and horizontal shift register electrodes and having openings above the photoelectric conversion elements, the light shielding metal layer serving as interconnects for making electrical connection to the plurality of vertical and horizontal shift register electrodes in the peripheral area.

As such, when employing the solid state image sensor according to the invention, the interlayer insulation film on the plurality of shift register electrodes in the peripheral area is formed thick between the light shielding metal layer and the plurality of shift register electrodes, and further formed to have a planarized surface. This prevents discontinuity in the light shielding metal layer overlying the plurality of shift register electrodes in the peripheral area and reduces power consumption of the image sensor. Furthermore, since the interlayer insulation film on the photoelectric conversion elements is formed lower than the shift register electrode adjacent the photoelectric conversion element, the light shielding metal layer can be formed to completely cover the sidewalls of the shift register electrode on the side of the photoelectric conversion element and therefore, probability of light incident on the photoelectric conversion element from a direction inclined relative to the normal of the surface of the photoelectric conversion element and entering a shift register channel below the plurality of shift register electrodes can be reduced.

DETAILED DESCRIPTION OF THE PREFERRED EMBODIMENTS

Preferred embodiments of the invention will be explained with reference to the accompanying drawings.

Figure 6:
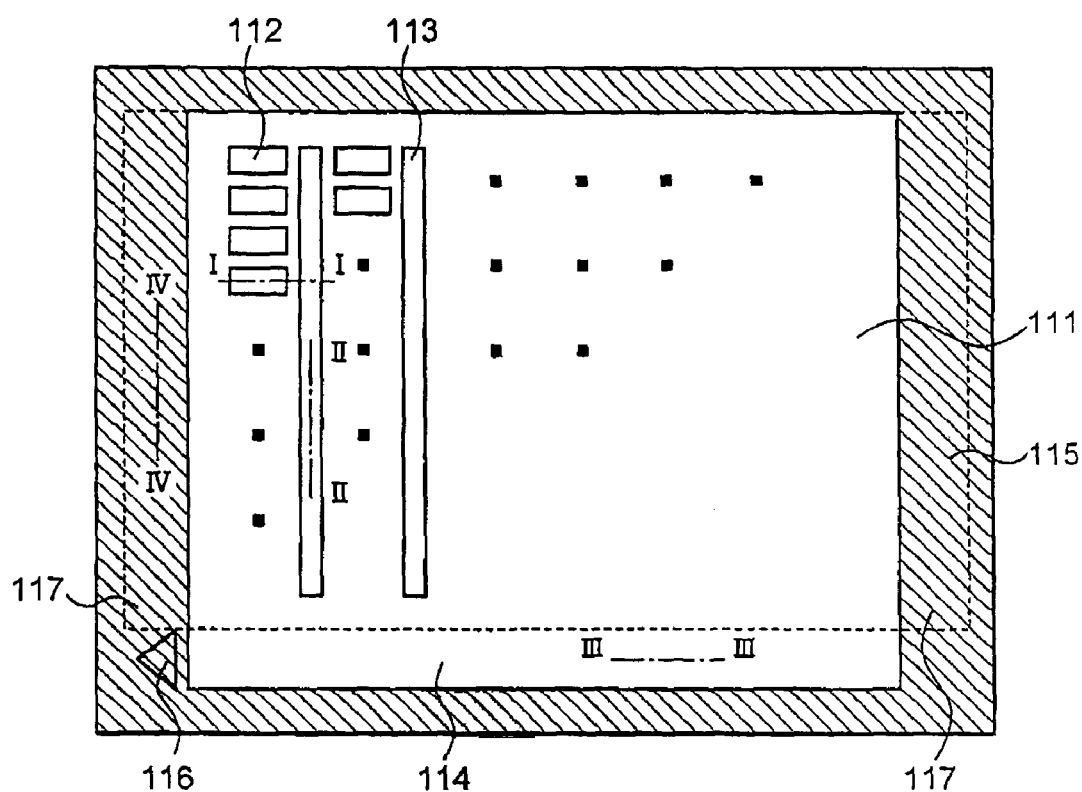
FIG. 6 is a schematic plan view of a solid state image sensor constructed in accordance with a first embodiment of the invention.

As shown in FIG. 6, a solid state image sensor according to a first embodiment of the invention includes an imaging area 111 (i.e., consisting essentially of photoelectric conversion regions 112, a vertical shift resister region 113 and a horizontal shift resister region 114) and a peripheral area 115 (i.e., consisting essentially of a signal output region 116 and an interconnect extension region 117). Note that the interconnect extension region 117 is provided in the peripheral area to allow vertical and horizontal shift register electrodes to be extended through the imaging area to the peripheral area. The above-described solid state image sensor is formed in the following manner.

A desired portion of a single layer of conductive film is etched away to form a plurality of vertical shift register electrodes and a plurality of horizontal shift register electrodes (hereinafter, those two types of electrodes are referred to also and generally as shift register electrodes). A distance (referred to as an electrode separation gap) between adjacent electrodes of the plurality of those shift register electrodes is determined to be in the range of about 0.25 µm to about 0.5 µm in order to achieve effective transfer of electric charges within a shift register channel underneath the shift register electrodes.

An insulating film is deposited over the entire structure to fill electrode separation gaps with the insulating film. Through use of a mask, the insulating film in the imaging area is etched back to adjust the height of the insulating film so that it becomes equal to or lower than the height of the shift register electrodes and the insulating film in the peripheral area 115 is not etched, i.e., left thick as it is.

Subsequently, a portion, located above the photoelectric conversion regions, of the conductive film is etched away to form openings for formation of photoelectric conversion elements.

An interlayer insulation film is formed over the entire structure and a metal layer is formed thereon to form a light shielding metal layer and metal interconnect lines at the same level.

As described above, the insulating film, denoted by slanting lines in FIG. 6, on the shift register electrodes in the peripheral area 115 is formed thicker than the insulating film on the shift register electrodes in the imaging area 111.

Figure 7A:
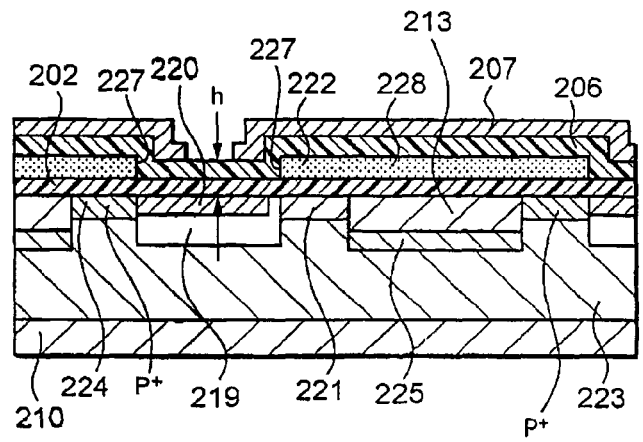
FIG. 7A is a cross sectional view of a photoelectric conversion element and a vertical shift register region constructed in accordance with the first embodiment of the invention.
Figure 7B:
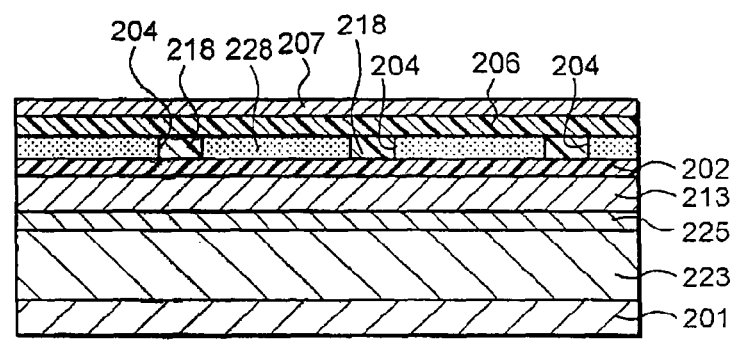
FIG. 7B is a cross-sectional view, taken along a direction in which electric charges are transferred, of the vertical shift register region constructed in accordance with the first embodiment of the invention.
Figure 7C:
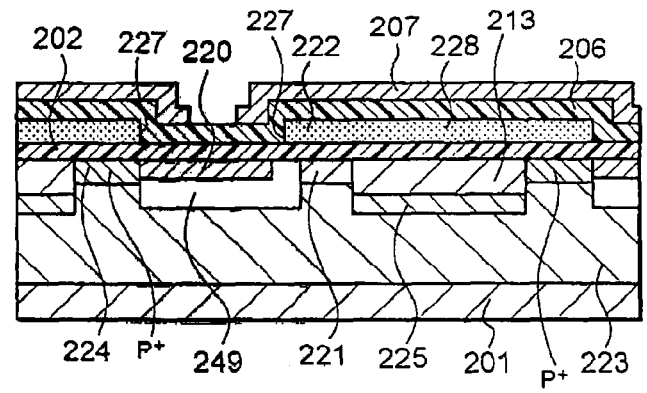
FIG. 7C is a cross sectional view of the photoelectric conversion element and the vertical shift register region constructed in accordance with a modification of the first embodiment of the invention.
Figure 8A:
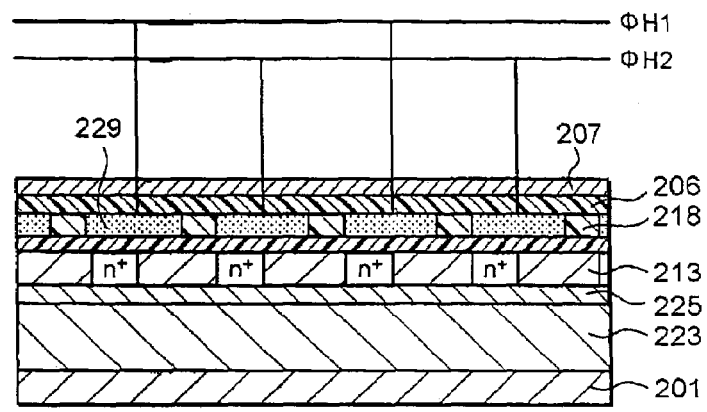
FIG. 8A is a cross sectional view, taken along a direction in which electric charges are transferred, of a horizontal shift register region.
Figure 8B:
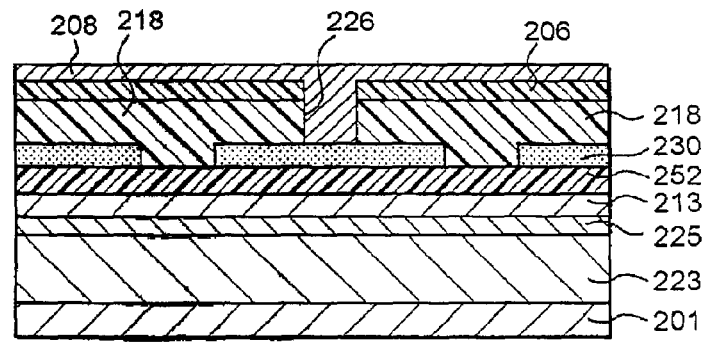
FIG. 8B is a cross sectional view of a connection between a shift register electrode and a metal interconnect line in a peripheral area.

FIGS. 7A-C are cross sectional views of a pixel of a solid state image sensor, according to the first embodiment of the invention, that incorporates therein buried photodiodes as a photoelectric conversion element. FIG. 7C illustrates a modification of the first embodiment, employed in the case where an N-well 249 is formed extending below the inside of a readout electrode 222 as a part of a vertical shift register electrode 228 to adjust a readout voltage.

In the embodiment, a plurality of vertical and horizontal shift register electrodes 228 and 229 in an imaging area, and a plurality of shift register electrodes 230 in a peripheral area are formed from a single layer of polysilicon. In this case, the plurality of vertical and horizontal shift register electrodes 228, 229 in the imaging area extend onto the peripheral area to thereby form the plurality of shift register electrodes 230 in the peripheral area. An insulating film 218 is formed within each of separation regions (electrode separation gaps) 204 that divide the single layer of polysilicon into a plurality of films in a column direction along the arrangement of the shift register electrodes, thereby allowing the surface of a substrate to be planarized. Formed on the planarized surface of the substrate are an interlayer insulation film 206 and a light shielding metal layer 207 (refer to FIG. 7B).

Furthermore, the single layer of polysilicon is subjected to two etching steps. Through the first etching step, a plurality of shift register electrodes 228, 229 and 230 are formed and through the second etching step, an opening 227 is formed on each of the photoelectric conversion regions. After formation of the opening 227 in the single layer of polysilicon on each of the photoelectric conversion regions through the second etching step, phosphorous ions are implanted into the photoelectric conversion region to form an N-well 219 as a photoelectric conversion element, which is formed self-aligned to a vertical shift register electrode as a mask.

How the solid state image sensor having the structure shown in FIGS. 7A-C, 8A (horizontal shift register region), 8B (peripheral area) is manufactured will be explained with reference to cross sectional views correspond to a photoelectric conversion region, a vertical shift register region, and a peripheral area, respectively. Note that illustration of process steps performed before formation of gate oxide film is omitted for simplification.

First, an N-type semiconductor substrate 301 having a field isolation dielectric 352 previously formed thereon is thermally oxidized to form a gate oxide film 302 on the substrate. Then, a conductive film 303 made of polysilicon is deposited over the gate oxide film 302 and the field isolation dielectric 352 using low-pressure CVD.

Figure 9A:
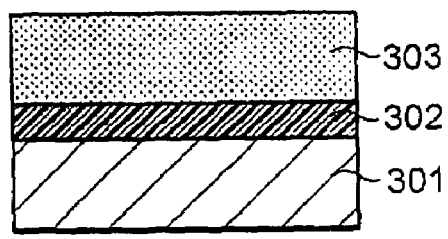
FIG. 9A is a cross sectional view illustrating a method for manufacturing a solid state image sensor of the first embodiment of the invention in the order of manufacturing steps and taken along line I-I (crossing photoelectric conversion element) of FIG. 6.
Figure 9B:
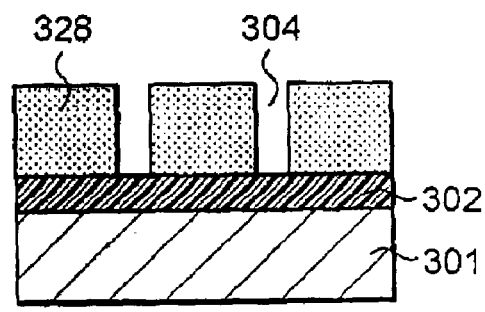
FIG. 9B is a cross sectional view illustrating the method for manufacturing a solid state image sensor of the first embodiment of the invention in the order of manufacturing steps and taken along line II-II (crossing vertical shift register region) of FIG. 6.
Figure 9C:
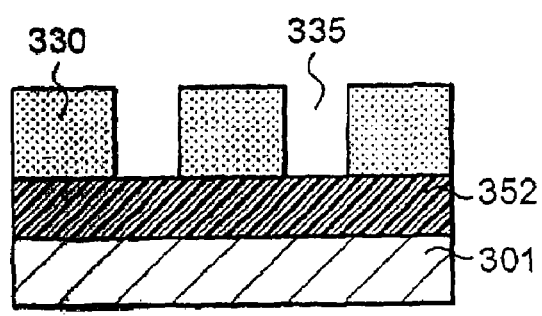
FIG. 9C is a cross sectional view illustrating the method for manufacturing a solid state image sensor of the first embodiment of the invention in the order of manufacturing steps and taken along line IV-IV (crossing peripheral area) of FIG. 6.

Thereafter, a desired portion of the conductive film 303 in the vertical and horizontal shift register regions is etched away to form separation regions 304 (electrode separation gaps between electrodes) and vertical and horizontal shift register electrodes 328, 329 and a desired portion of the conductive film 303 in the peripheral area is etched away to form separation regions 335 and shift register electrodes 330 (refer to FIGS. 9A-C). In this case, though not shown clearly in FIG. 6, the vertical and horizontal shift register electrodes 328, 329 in the imaging area extend to the peripheral area to form the shift register electrodes 330 in the peripheral area.

Subsequently, an insulating film 318 that can be thermally reflowed, for example, a Boro-Phospharas-Silicate-Glass (BPSG) film is deposited over the entire surface of the substrate. In this case, the BPSG film is preferably formed to have a thickness approximately equal to a width of the separation region 335 to be filled with the film, which width is largest among widths of separation regions.

Figure 10A:
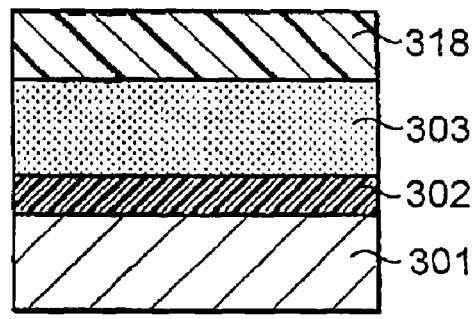
FIGS. 10A, 10B and 10C are cross sectional views illustrating steps subsequent to the steps of FIGS. 9A, 9B and 9C, respectively.
Figure 10B:
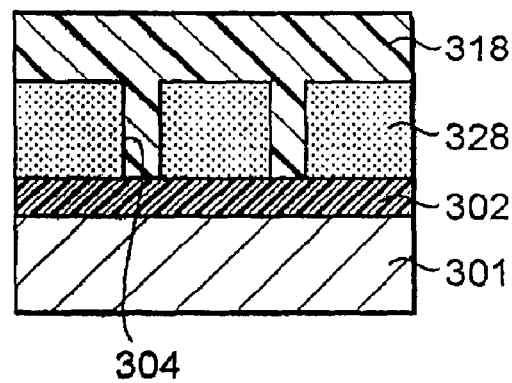
Figure 10C:
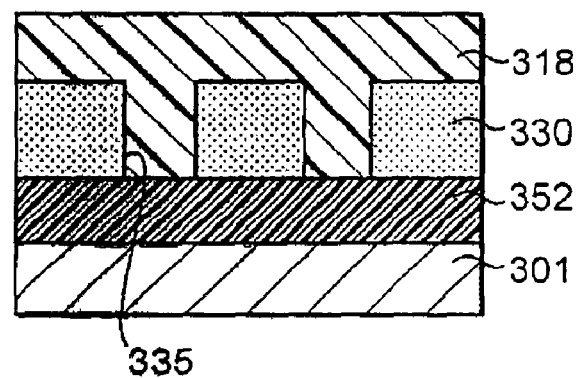

Then, the substrate is heated to temperatures of about 850 to 950 degrees. C. in a nitrogen atmosphere and the insulating film 318 is reflowed and planarized (refer to FIGS. 10A-C).

At this point, in addition to the separation regions 304 in the imaging area, the separation regions 335 between the shift register electrodes 330 in the peripheral area are also filled with the insulating film 318 whose surface is planarized also above the separation regions 335.

Figure 11A:
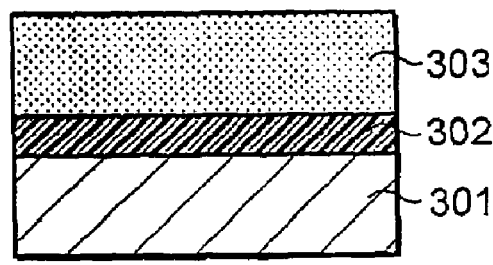
FIGS. 11A, 11B and 11C are cross sectional views illustrating steps subsequent to the steps of FIGS. 10A, 10B and 10C, respectively.
Figure 11B:
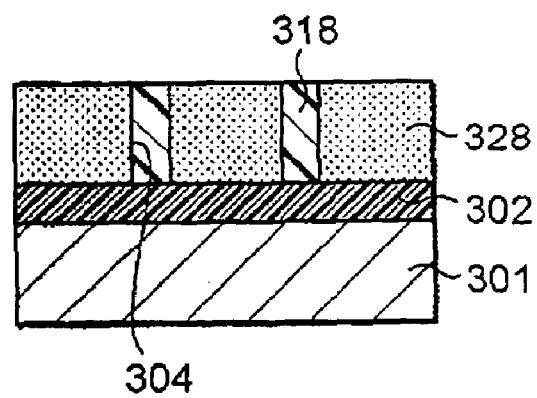
Figure 11C:
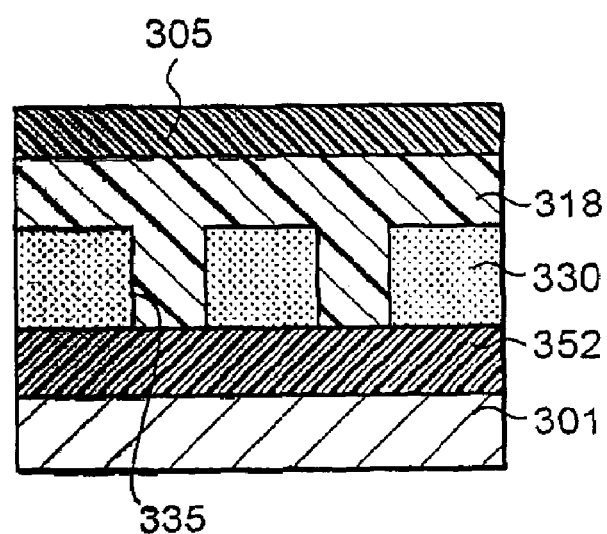

Subsequently, the insulating film 318 is etched using a photoresist 305 as a mask to expose the surface of the conductive film 303 in the photoelectric conversion regions and the vertical and horizontal shift register regions while filling the electrode separation gaps 304 with the insulating film 318 (refer to FIGS. 11A-C).

Figure 12A:
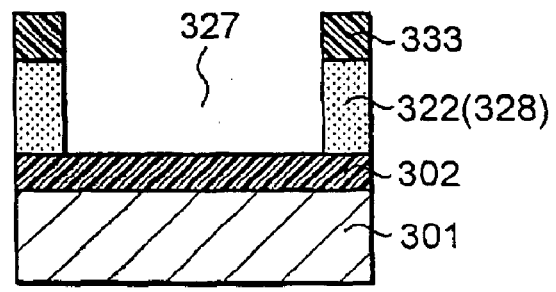
FIGS. 12A, 12B and 12C are cross sectional views illustrating steps subsequent to the steps of FIGS. 11A, 11B and 11C, respectively.
Figure 12B:
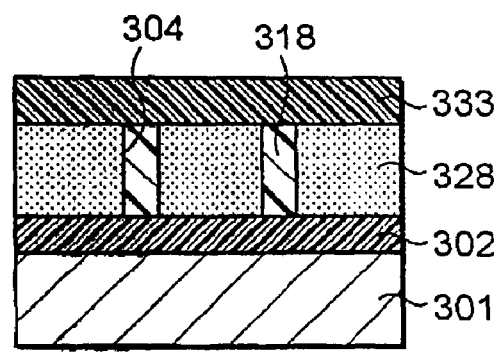
Figure 12C:
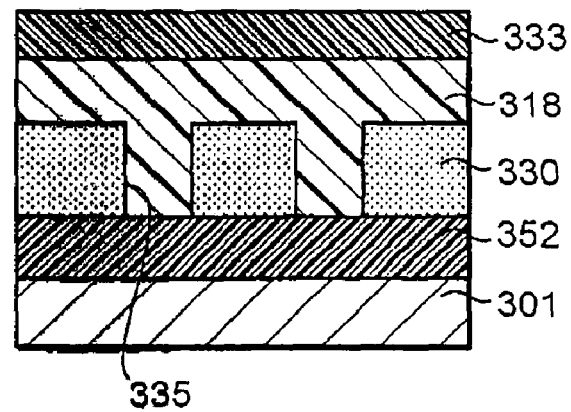

Thereafter, the photoresist 305 is removed and a photoresist 333 is newly coated on the entire structure and patterned. Then, the conductive film 303 in the photoelectric conversion regions is dry-etched using the photoresist 333 as a mask and openings 327 are formed in the conductive film 303. Thus, a readout electrode 322 is formed as a part of the vertical shift register electrode 328 (refer to FIGS. 12A-C).

Figure 13A:
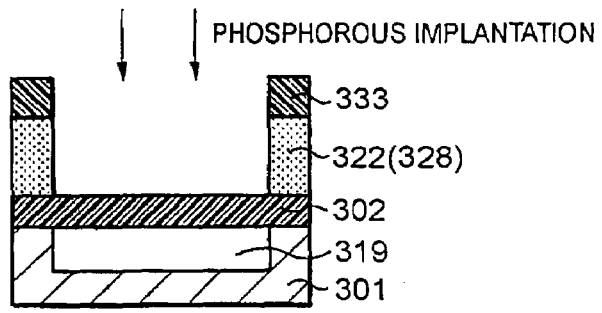
FIGS. 13A, 13B and 13C are cross sectional views illustrating steps subsequent to the steps of FIGS. 12A, 12B and 12C, respectively.
Figure 13B:
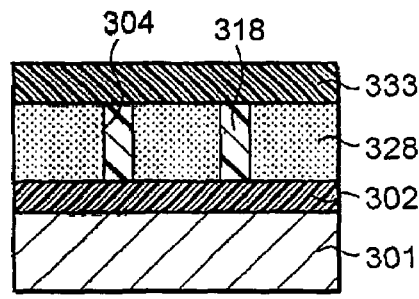
Figure 13C:
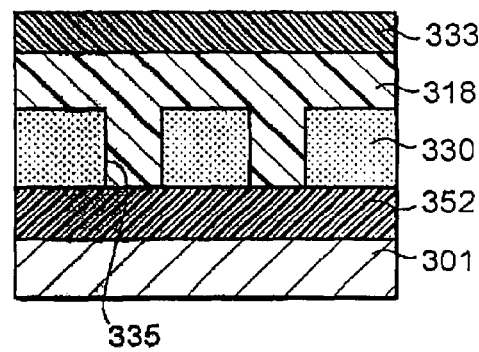

Subsequently, phosphorous ion implant is carried out using the photoresist 333 and the vertical shift register electrodes 328 as a mask to form N-wells 319 as a photoelectric conversion element (refer to FIGS. 13A-C). In this case, although the case where phosphorous ions are implanted from a direction vertical to the surface of the substrate is explained in the description of the embodiment, the embodiment may be configured, as shown in FIG. 13D, to implant phosphorous ions from a direction inclined relative to the normal to the surface of the substrate in order to form an N-well 349, which extends below the inside of the readout electrode 322 as a part of the vertical shift register electrode 328 to permit adjustment of readout voltage.

Figure 13D:
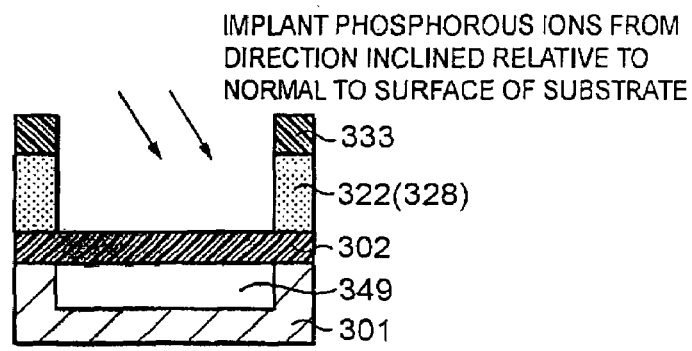
FIG. 13D is a cross sectional view illustrating how phosphorous ions are implanted into a photoelectric conversion region from a direction inclined relative to the normal of substrate and a modification of the manufacturing step shown in FIG. 13A.

It should be appreciated that although each of other embodiments described below also includes, as a modification of the method for manufacturing a solid state image sensor according to the invention, the case where phosphorous ions are implanted from a direction inclined relative to the normal to the surface of the substrate as shown in FIG. 13D, illustration of the modification is omitted for simplification. Therefore, in the embodiment, explanation is made of the process steps to be performed on and after the step shown in FIGS. 14A-C that is subsequent to the step shown in FIGS. 13A-C without illustration of a sectional view corresponding to that shown in FIG. 13D.

Figure 14A:
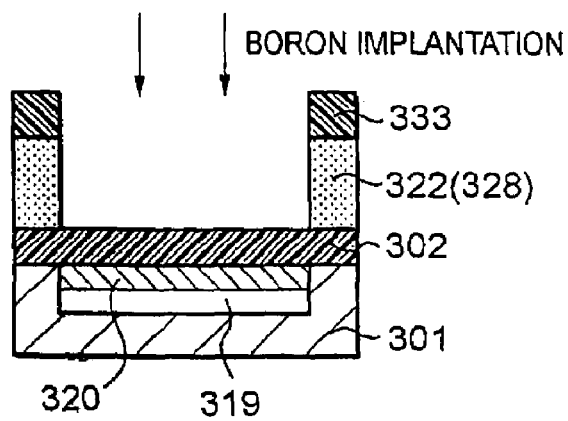
FIGS. 14A, 14B and 14C are cross sectional views illustrating steps subsequent to the steps of FIGS. 13A, 13B and 14C, respectively.
Figure 14B:
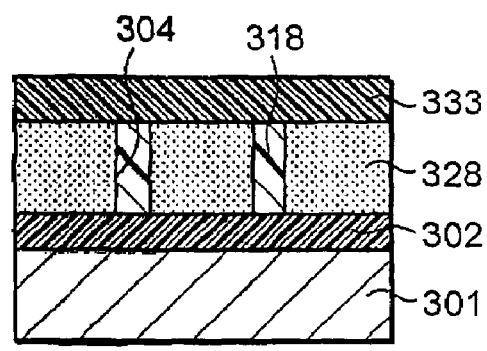
Figure 14C:
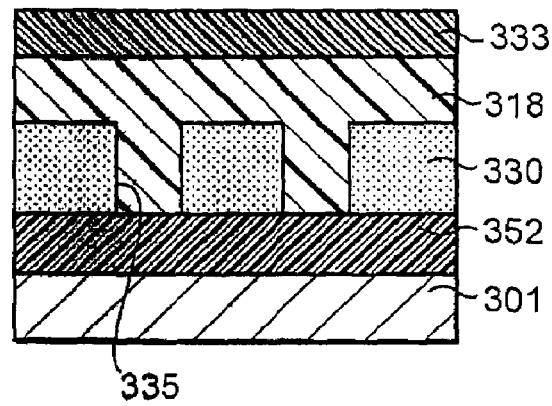

Then, boron ions are implanted into the N-wells 319, using the photoresist 333 and the vertical shift register electrodes 328 as a mask, to form a p+ region 320 in a surface portion of each of the N-wells 319, resulting in formation of buried photodiode (refer to FIGS. 14A-C).

Figure 1A:
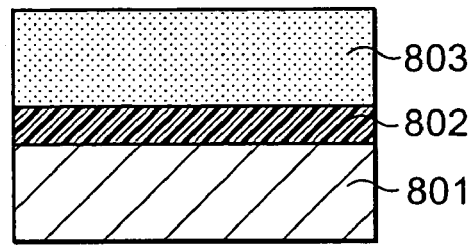
FIG. 1A is a cross sectional view of a region corresponding to a photoelectric conversion element to be formed later in a conventional method for manufacturing a solid state image sensor that incorporates therein shift register electrodes made from a single layer of conductive film, which view is illustrated in the order of manufacturing steps.
Figure 1B:
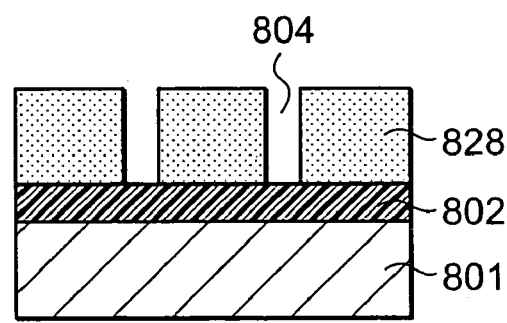
FIG. 1B is a cross sectional view of an imaging area constructed in accordance with the conventional method for manufacturing a solid state image sensor, which view is illustrated in the order of manufacturing steps.
Figure 1C:
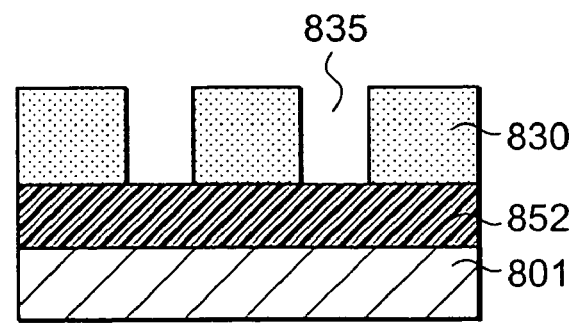
FIG. 1C is a cross sectional view of a peripheral area constructed in accordance with the conventional method for manufacturing a solid state image sensor, which view is illustrated in the order of manufacturing steps.
Figure 2A:
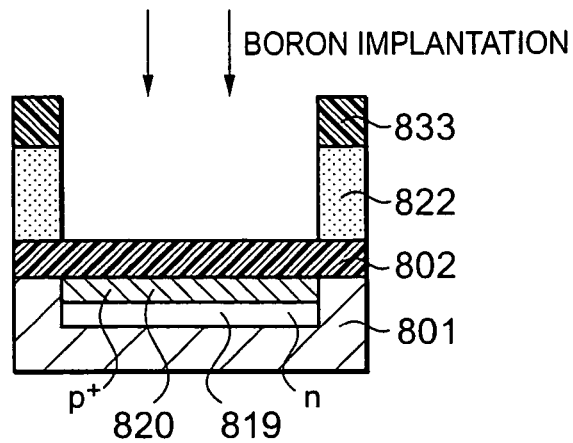
FIGS. 2A, 2B and 2C are cross sectional views illustrating steps subsequent to the steps of FIGS. 1A, 1B and 1C, respectively.
Figure 2B:
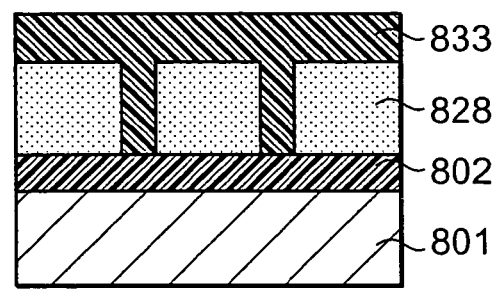
Figure 2C:
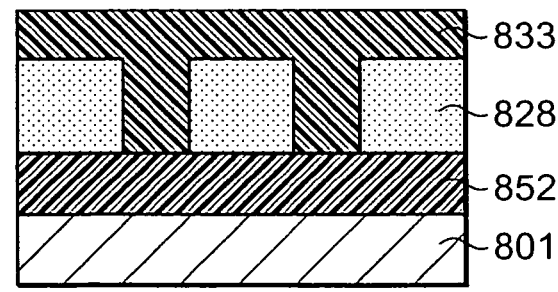
Figure 3A:
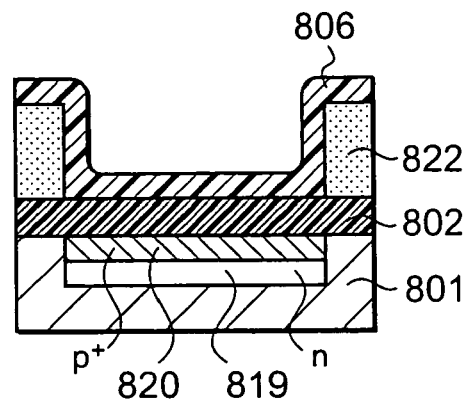
FIGS. 3A, 3B and 3C are cross sectional views illustrating steps subsequent to the steps of FIGS. 2A, 2B and 2C, respectively.
Figure 3B:
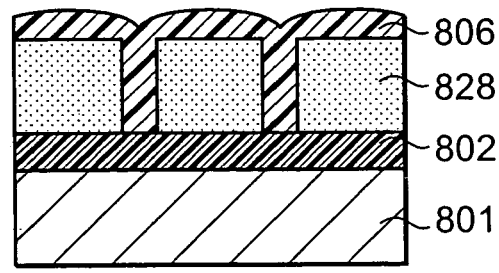
Figure 3C:
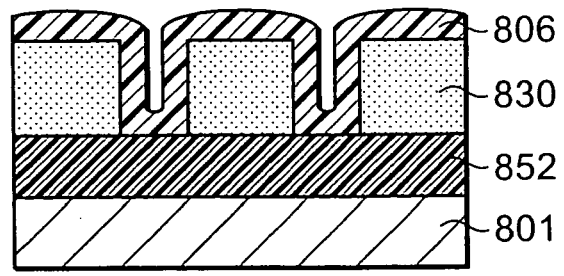
Figure 4A:
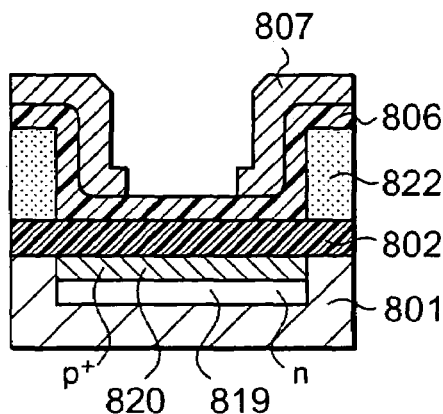
FIGS. 4A, 4B and 4C are cross sectional views illustrating steps subsequent to the steps of FIGS. 3A, 3B and 3C, respectively.
Figure 4B:
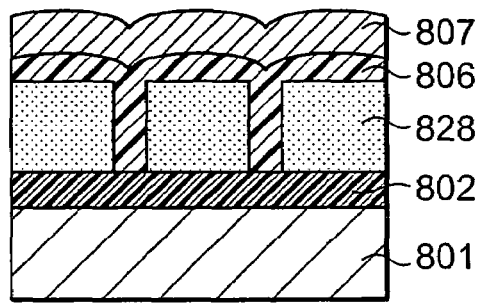
Figure 4C:
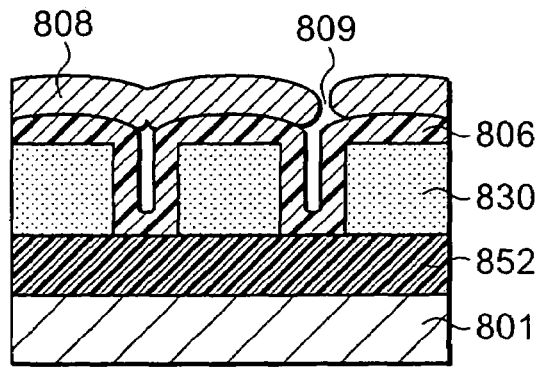
Figure 5:
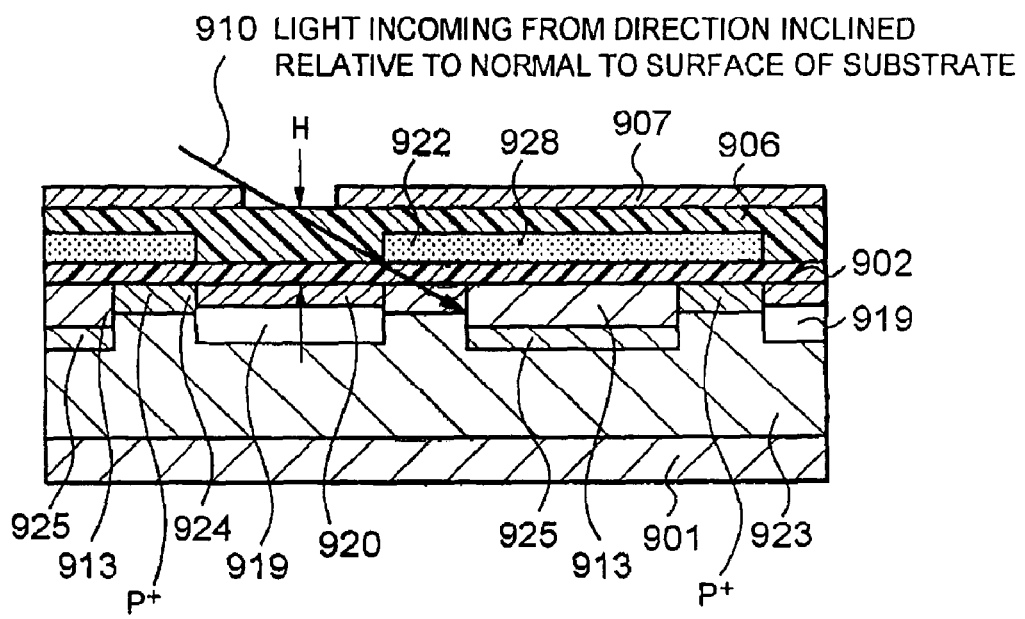
FIG. 5 is a cross sectional view to explain how a problem occurs when the photoelectric conversion region is planarized through use of interlayer insulation film in the conventional method for manufacturing a solid state image sensor.
Figure 15A:
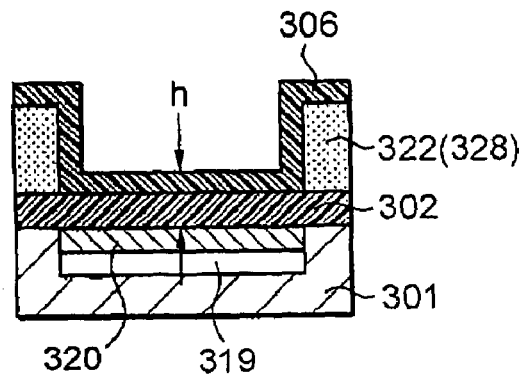
FIGS. 15A, 15B and 15C are cross sectional views illustrating steps subsequent to the steps of FIGS. 14A, 14B and 14C, respectively.
Figure 15B:
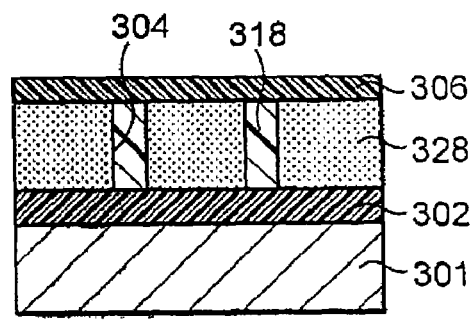
Figure 15C:
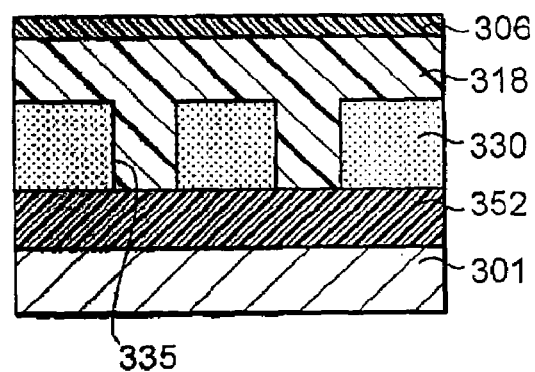

Thereafter, the photoresist 333 is removed and an interlayer insulation film 306 is formed over the entire structure (refer to FIGS. 15A-C). At this point, it is apparent to those skill in the art that as shown in FIG. 15A, the surface of the interlayer insulation film 306 above the N-well 319 is positioned at a height "h" from the surface of the substrate, which height is far lower than the height "H" of the surface of the interlayer insulation film 906 in the conventional image sensor shown in FIG. 5.

Figure 16A:
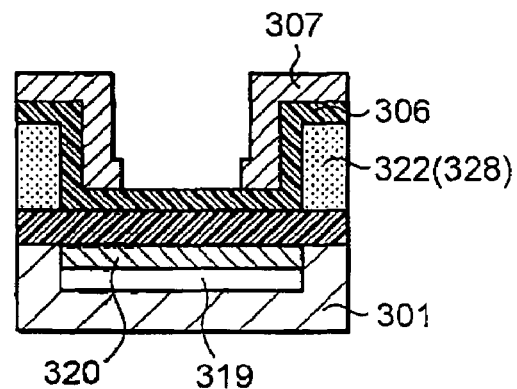
FIGS. 16A, 16B and 16C are cross sectional views illustrating steps subsequent to the steps of FIGS. 15A, 15B and 15C, respectively.
Figure 16B:
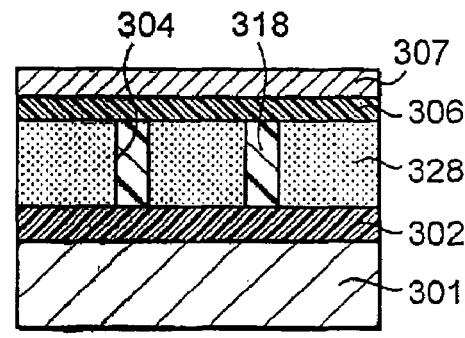
Figure 16C:
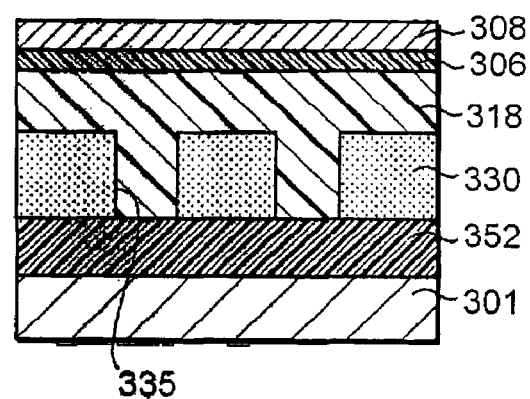

Then, a light shielding metal layer 307 is formed on a portion, excluding the photoelectric conversion elements, of the interlayer insulation film 306. Note that in the peripheral area, contact holes, though not shown, are formed in advance in the interlayer insulation film 306 and metal interconnect lines 308 are formed so as to extend on the interlayer insulation film 306 and fill the contact holes with a conductive material making up the interconnect line (refer to FIGS. 16A-C). As shown in FIG. 16A, since the sidewall of the readout electrode 322 is substantially covered by the light shielding metal layer 307, light incoming from a direction inclined relative to the normal to the surface of the substrate toward the photoelectric conversion element can be prevented from entering the vertical shift register channel adjacent the photoelectric conversion element.

Thus, the solid state image sensor, shown in FIGS. 7A-C, 8A, 8B, of the invention can be obtained.

In summary, in the first embodiment of the invention, the conductive film 303 is patterned through two etching steps. Through the first etching step, a plurality of vertical and horizontal shift register electrodes are formed, and through the second etching step, an opening is formed on each of the plurality of vertical shift register electrodes on the photoelectric conversion regions. In this case, the vertical shift register electrode adjacent the corresponding photoelectric conversion region also serves as a readout electrode for allowing signal charges generated within a later-formed photoelectric conversion element to pass underneath the readout electrode to the vertical shift register channel. Performed between the two etching steps is the following step. That is, after completion of the first etching step, an insulating film 318 is deposited thick over the entire structure to completely cover the plurality of vertical and horizontal shift register electrodes. Furthermore, etch-back is carried out in a situation where only the insulating film 318 located in the peripheral area is covered with a photoresist as a mask and as a result, the insulating film 318 is left as it is only on the plurality of shift register electrodes 330 in the peripheral area, i.e., the insulating film 318 on the plurality of shift register electrodes 330 in the peripheral area is not etched. At this point, in the vertical and horizontal shift register regions (i.e., the imaging area), the insulating film 318 is formed such that only the gaps between the vertical and horizontal shift register electrodes are filled with the film to thereby provide a planarized surface in the imaging area. Then, after the second etching step, an interlayer insulation film 306 having an appropriate thickness is formed over the entire structure. At this point, the surface, shown in FIG. 7A, of the interlayer insulation film 306 above the N-well 319 is positioned at a height "h" from the surface of the substrate, which height is far lower than the height "H" of the surface of the interlayer insulation film 906 in the conventional image sensor shown in FIG. 5. Thus, the sidewall of the readout electrode 322 is substantially covered by the light shielding metal layer 307 and therefore, light incoming from a direction inclined relative to the normal to the surface of the substrate toward the photoelectric conversion element can be prevented from entering the vertical shift register channel adjacent the photoelectric conversion element, thereby allowing the image sensor to reduce smear brightness and further reduce parasitic capacitance between the metal interconnect lines and diffusion layers, polysilicon electrodes in the peripheral area, which in turn results in low power consumption of image sensor.

Additionally, since the electrode separation gaps 304 are filled with the insulating film to provide a substantially planarized surface in the imaging area, step coverage defined as a measure of how well the light shielding metal layer 307 formed above the electrode separation gaps conform over an underlying step is improved, effectively preventing light from entering the vertical and horizontal shift register channels. Moreover, step coverage defined as a measure of how well the metal interconnect lines 308 above the plurality of shift register electrodes 330 conform over an underlying step is improved, achieving an advantageous interconnect structure which allows a charge transfer pulse to reliably be applied to the associated shift register electrode.

Furthermore, after formation of the openings 327 in the plurality of vertical shift register electrodes, when phosphorous ions are implanted, self-aligned to the vertical shift register electrodes as a mask, into the photoelectric conversion regions to form N-wells as a photoelectric conversion element, the photoelectric conversion element and the readout electrode (shift register electrode 322) are formed without displacement relative to each other, allowing the image sensor to stably retrieve signal charges from the photoelectric conversion elements and transfer the charges to the vertical shift register channel.

Subsequently, a solid state image sensor according to a second embodiment of the invention will be explained below with reference to the accompanying drawings.

Figure 17:
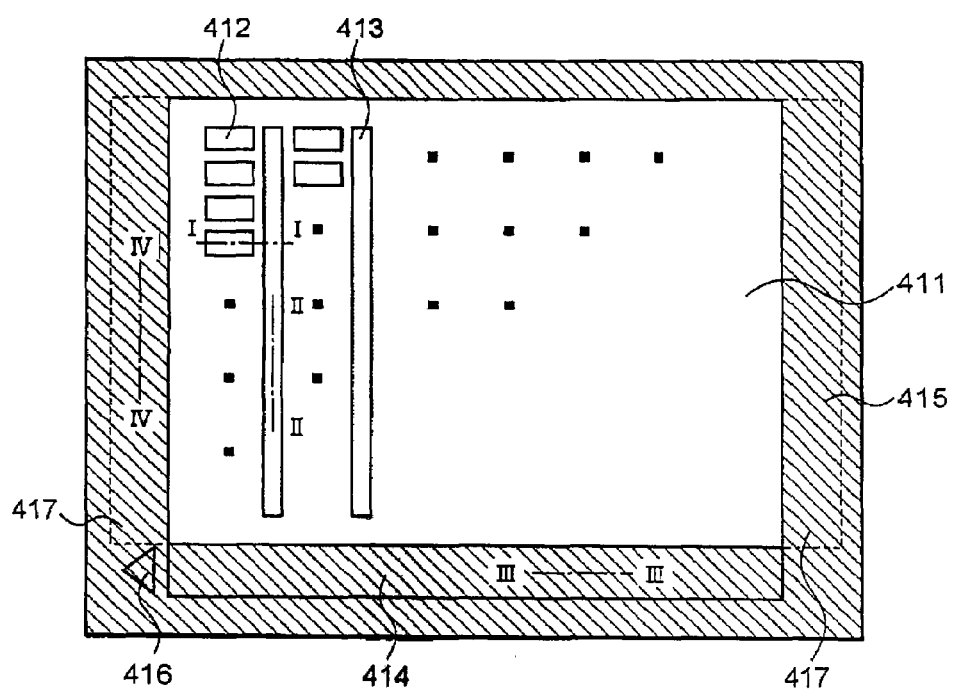
FIG. 17 is a schematic plan view of a solid state image sensor constructed in according with a second embodiment of the invention.

In FIG. 17, the area denoted by slanted lines is an area in which an insulating film provided to fill separation regions 735 with the film is not etched, i.e., left as it is.

The difference between the first and second embodiments is that in the second embodiment, an insulating film provided to fill separation regions (electrode separation gaps) is not etched, i.e., left as it is in a horizontal shift register region.

Subsequently, how a horizontal shift register region 414 of the embodiment is formed will be explained with reference to the cross sectional view thereof. Note that the structure of a photoelectric conversion region, a vertical shift register region and an interconnect extension region is similar to that in the first embodiment.

Figure 18:
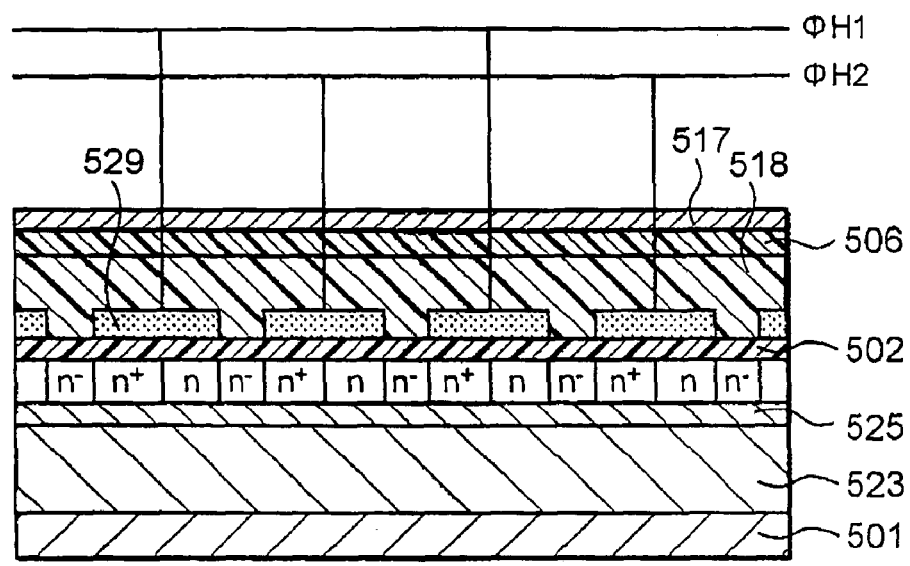
FIG. 18 is a cross sectional view of a horizontal shift register region of a solid state image sensor constructed in accordance with the second embodiment of the invention.

As shown in FIG. 18, in the horizontal shift register region, an insulating film 518 is not etched back, i.e., left thick as it is.

In addition to the beneficial effects by employment of the first embodiment, employment of the second embodiment produces beneficial effects because an interlayer insulation film is formed thick between horizontal shift register electrodes and metal interconnect lines in the horizontal shift register region so as to reduce parasitic capacitance associated with the metal interconnect lines. Accordingly, even when a drive voltage applied to the shift register electrodes in the peripheral area is low, the waveform of charge transfer pulse is not degraded, permitting signal charges to effectively be transferred within a horizontal shift register channel, and therefore, a horizontal shift register can operate at low power consumption.

Subsequently, a solid state image sensor according to a third embodiment of the invention will be explained below with reference to the accompanying drawings.

The difference between the first and third embodiments is that in the third embodiment, a surface portion of shift register electrodes is silicided to reduce electrode resistance.

Also in the embodiment, a conductive film is patterned through two etching steps. That is, through the first etching step, a plurality of vertical and horizontal shift register electrodes are formed and through the second etching step, an opening is formed in each of the plurality of vertical shift register electrodes on photoelectric conversion regions. Performed between the two etching steps is the following step. That is, after the first etching step, an insulating film is deposited thick over the entire structure to completely cover the plurality of vertical and horizontal shift register electrodes. Furthermore, etch-back is carried out in a situation where only the insulating film in the peripheral area is covered with a photoresist as a mask and as a result, the insulating film in the peripheral area is not etched, i.e., left thick as it is. At this point, the insulating film is formed within each of the gaps between the vertical and horizontal shift register electrodes, so that in combination with the insulating film, the vertical and horizontal shift register electrodes make up a planarized surface in the vertical and horizontal shift register regions. Then, formed in surface portions of the plurality of vertical and horizontal shift register electrodes is a silicide layer. Thereafter, through the second etching step, an opening is formed in each of the plurality of vertical shift register electrodes on the photoelectric conversion regions. Through the openings, phosphorous ions are implanted, self-aligned to the vertical shift register electrodes 628 as a mask, into the substrate to form N-wells as a photoelectric conversion element (refer to FIGS. 19A-C). A more detailed explanation is made of the above-described steps below.

Figure 20A:
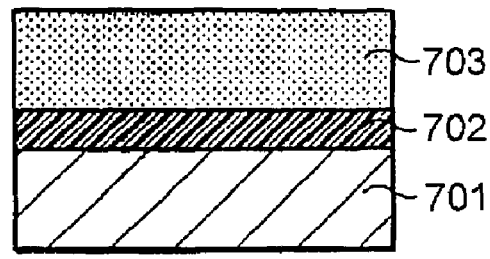
FIG. 20A is a cross sectional view illustrating a method for manufacturing a solid state image sensor constructed in accordance with the third embodiment of the invention in the order of manufacturing steps and taken along line I-I (crossing photoelectric conversion element) of FIG. 17.
Figure 20B:
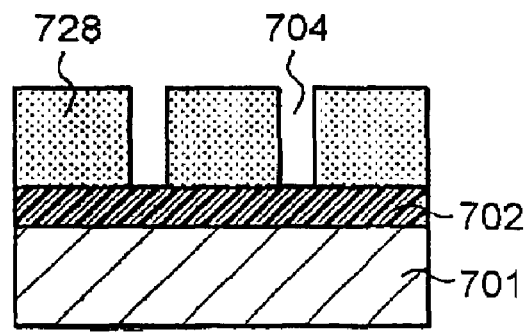
FIG. 20B is a cross sectional view illustrating the method for manufacturing a solid state image sensor constructed in accordance with the third embodiment of the invention in the order of manufacturing steps and taken along line II-II (crossing vertical shift register region) of FIG. 17.
Figure 20C:
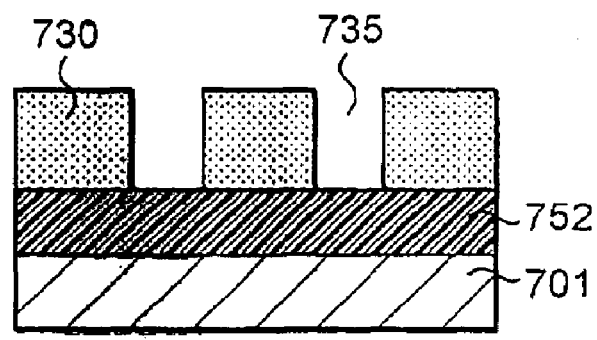
FIG. 20C is a cross sectional view illustrating the method for manufacturing a solid state image sensor constructed in accordance with the third embodiment of the invention in the order of manufacturing steps and taken along line III-III (crossing peripheral area) of FIG. 17.

An N-type semiconductor substrate 701 having a field isolation dielectric 752 previously formed thereon is thermally oxidized to form a gate oxide film 702 in a surface portion of the substrate. Then, a conductive film 703 made of polysilicon and making up electrodes is deposited over the gate oxide film 702 and the filed isolation layer 752 using low-pressure CVD. Thereafter, a desired portion of the conductive film 703 is etched away to form separation regions 704 (electrode separation gaps) in vertical and horizontal shift register regions (i.e., an imaging area) and separation regions 735 in a peripheral area (refer to FIGS. 20A-C).

Subsequently, an insulating film 718 that can be thermally reflowed, for example, a BPSG film is deposited over the entire surface of the substrate. In this case, the BPSG film is preferably deposited to have a thickness approximately equal to a width of the separation region to be filled with the film, which width is largest among widths of separation regions. Accordingly, the separation regions 735 in the peripheral area are also filled with the insulating film 718.

Figure 21A:
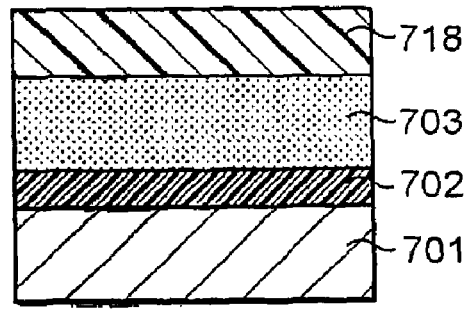
FIGS. 21A, 21B and 21C are cross sectional views illustrating steps subsequent to the steps of FIGS. 20A, 20B and 20C, respectively.
Figure 21B:
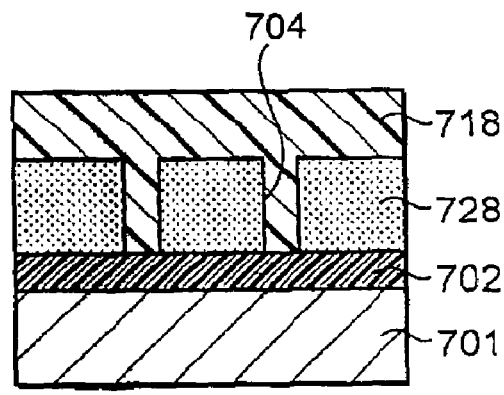
Figure 21C:
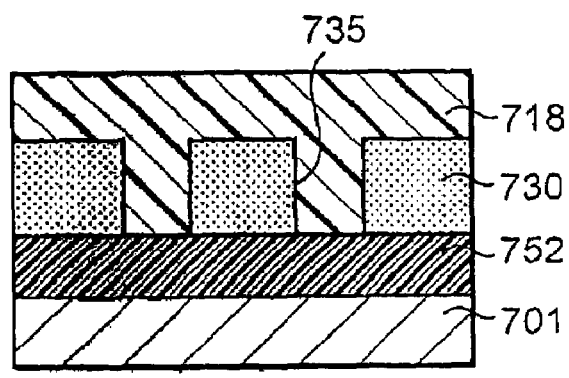

Thereafter, the substrate is heated to temperatures of about 850 to 950 degrees. C. in a nitrogen atmosphere and the insulating film 718 above the separation regions 735 in the peripheral area is reflowed and planarized (refer to FIGS. 21A-C).

Figure 22A:
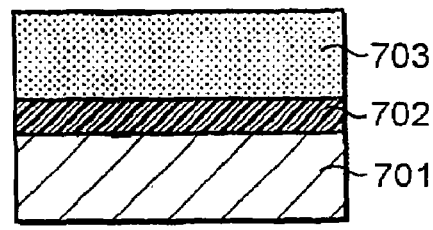
FIGS. 22A, 22B and 22C are cross sectional views illustrating steps subsequent to the steps of FIGS. 21A, 21B and 21C, respectively.
Figure 22B:
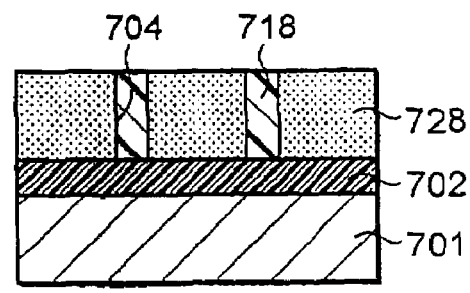
Figure 22C:
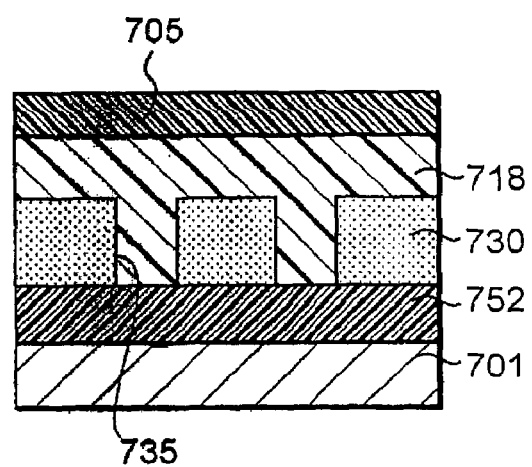

Subsequently, the insulating film 718 is etched using a photoresist 705 as a mask to expose the surface of the conductive film 703 in the imaging area and the electrode separation gaps 704 are just filled up with the insulating film 718 (refer to FIGS. 22A-C).

Figure 23A:
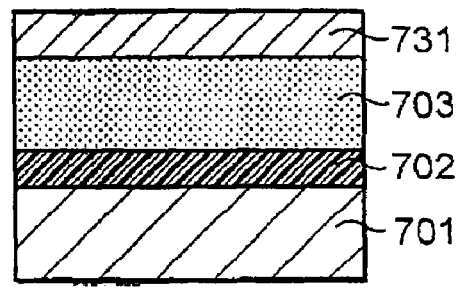
FIGS. 23A, 23B and 23C are cross sectional views illustrating steps subsequent to the steps of FIGS. 22A, 22B and 22C, respectively.
Figure 23B:
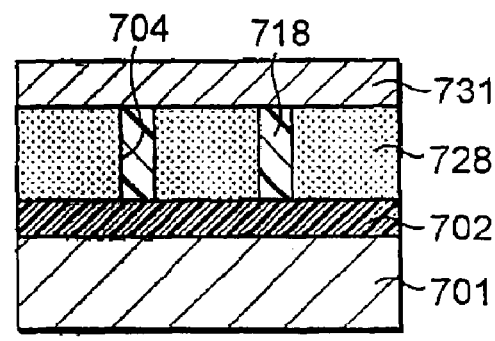
Figure 23C:
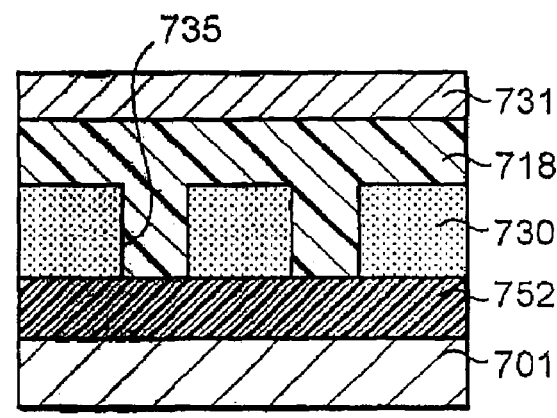

Then, a refractory metal film such as a titanium film 731, or a silicided refractory metal film is deposited over the entire surface of the substrate (refer to FIGS. 23A-C).

Figure 24A:
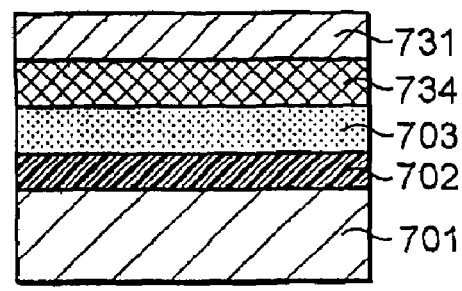
FIGS. 24A, 24B and 24C are cross sectional views illustrating steps subsequent to the steps of FIGS. 23A, 23B and 23C, respectively.
Figure 24B:
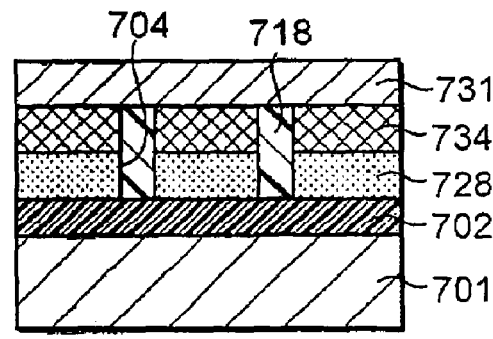
Figure 24C:
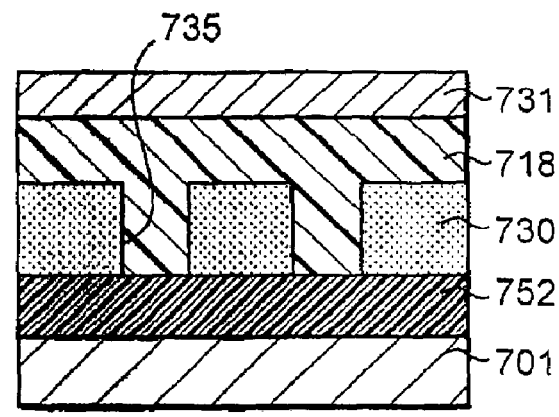

Thereafter, the substrate is subjected to a heat treatment at a temperature of about 700 degrees. C. in a nitrogen atmosphere in order to react the titanium with the polysilicon as a conductive film and the surface portion of polysilicon is silicided to form a titanium silicide 734. At this point, a portion, not exposed to the outside, i.e., covered with the insulating film 718, of the polysilicon, is not silicided (refer to FIGS. 24A-C).

Figure 25A:
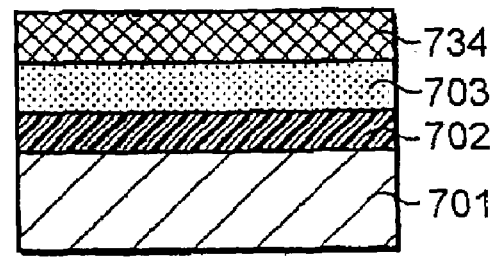
FIGS. 25A, 25B and 25C are cross sectional views illustrating steps subsequent to the steps of FIGS. 24A, 24B and 24C, respectively.
Figure 25B:
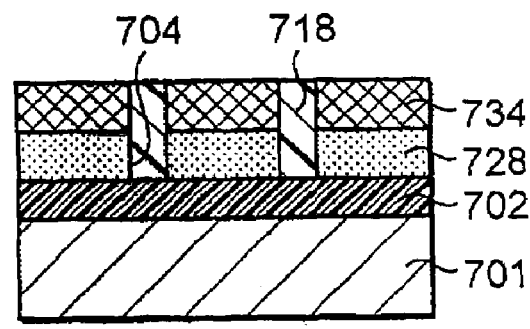
Figure 25C:
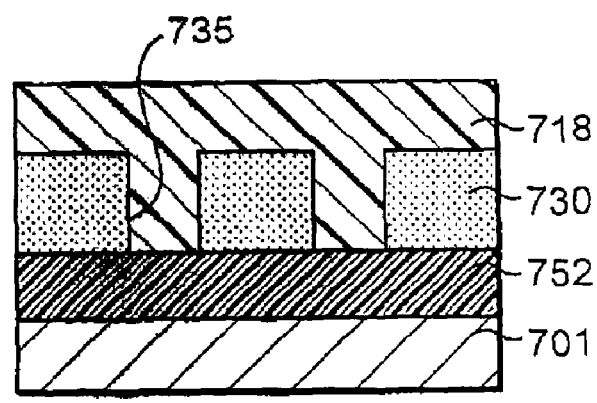

Subsequently, an unreacted titanium film 731 is etched away (refer to FIGS. 25A-C).

Figure 26A:
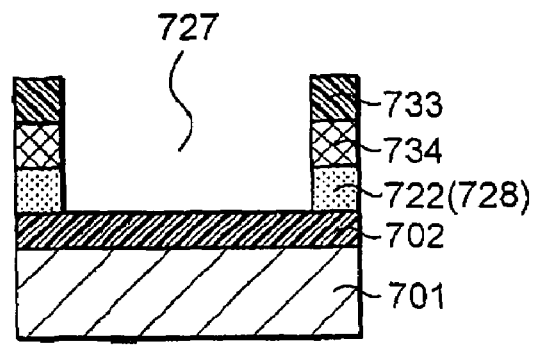
FIGS. 26A, 26B and 26C are cross sectional views illustrating steps subsequent to the steps of FIGS. 25A, 25B and 25C, respectively.
Figure 26B:
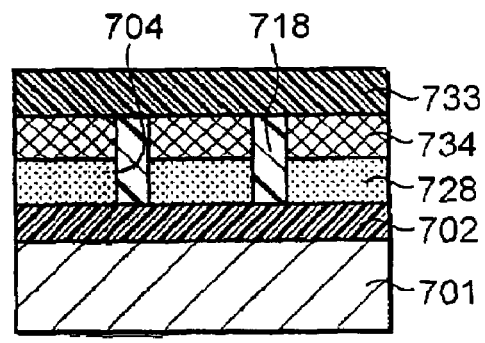
Figure 26C:
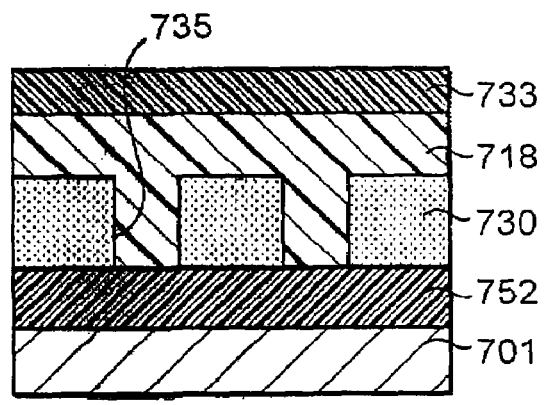

Then, a photoresist 733 is coated on the entire surface of the substrate and patterned to have an opening on each of the photoelectric conversion regions. Thereafter, a desired portion, located in the photoelectric conversion regions, of the silicided film (titanium silicide) 734 and the conductive film 703 is dry-etched and removed using the photoresist 733 as a mask to form an opening 727 in the silicided film and the conductive film on each of the photoelectric conversion regions and a readout electrode 722 as apart of a vertical shift register electrode 728 (refer to FIGS. 26A-C).

Figure 27A:
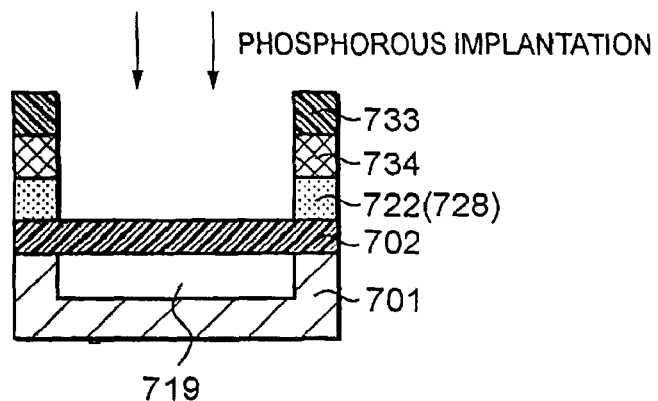
FIGS. 27A, 27B and 27C are cross sectional views illustrating steps subsequent to the steps of FIGS. 26A, 26B and 26C, respectively.
Figure 27B:
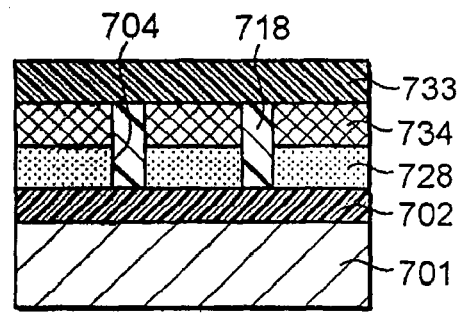
Figure 27C:
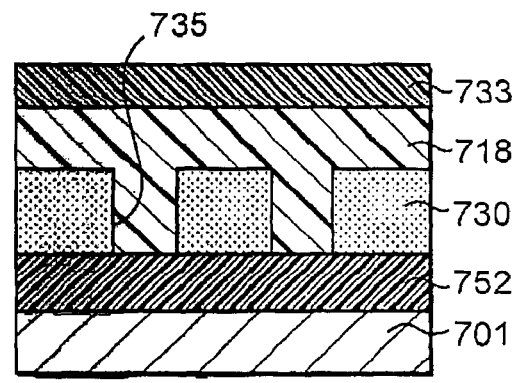

Subsequently, phosphorous ions are implanted through the openings 727 into the substrate using the photoresist 733 and the vertical shift register electrodes 728 as a mask to form N-wells 719 as a photoelectric conversion element (refer to FIGS. 27A-C).

Figure 28A:
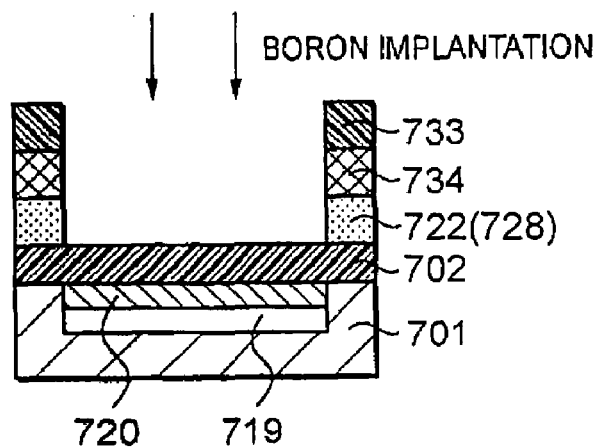
FIGS. 28A, 28B and 28C are cross sectional views illustrating steps subsequent to the steps of FIGS. 27A, 27B and 27C, respectively.
Figure 28B:
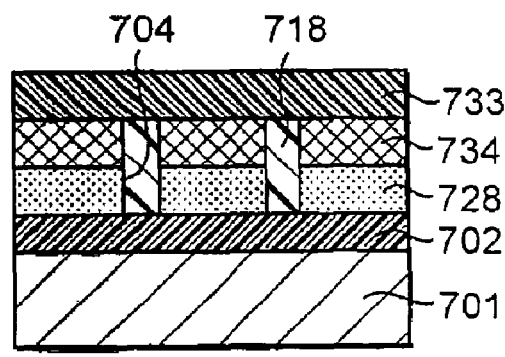
Figure 28C:
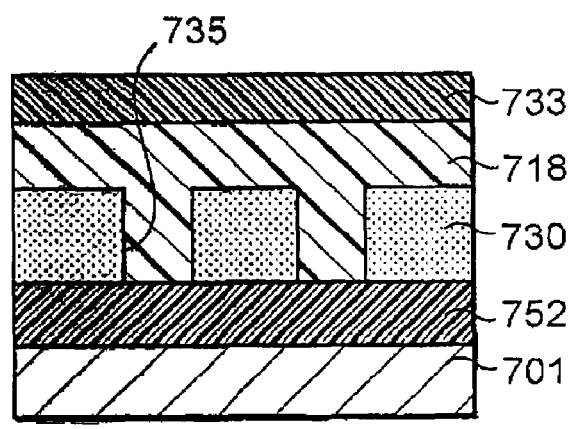

Then, boron ions are implanted into the substrate using the photoresist 733 and the vertical shift register electrodes 728 as a mask to form a p.sup.+region 720 in a surface portion of each of the N-wells 719 in order to use the N-wells 719 as a buried photodiode (refer to FIGS. 28A-C).

Figure 29A:
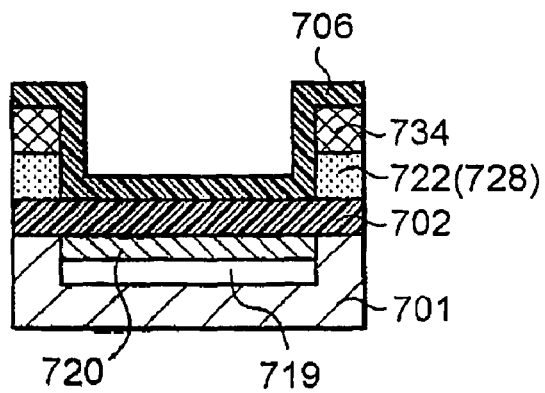
FIGS. 29A, 29B and 29C are cross sectional views illustrating steps subsequent to the steps of FIGS. 28A, 28B and 28C, respectively.
Figure 29B:
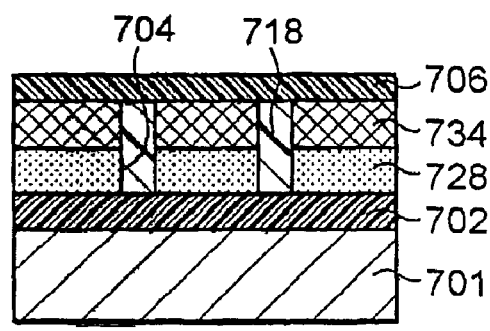
Figure 29C:
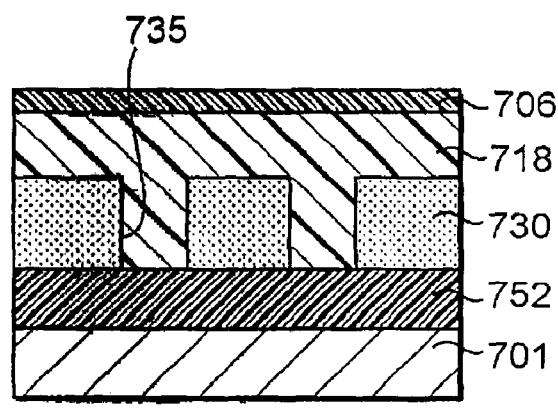

Thereafter, the photoresist 733 is removed and an interlayer insulation film 706 is formed over the entire structure (refer to FIGS. 29A-C).

Figure 30A:
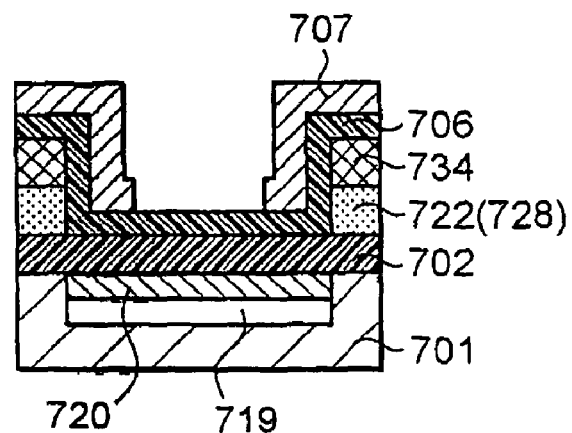
FIGS. 30A, 30B and 30C are cross sectional views illustrating steps subsequent to the steps of FIGS. 29A, 29B and 29C, respectively.
Figure 30B:
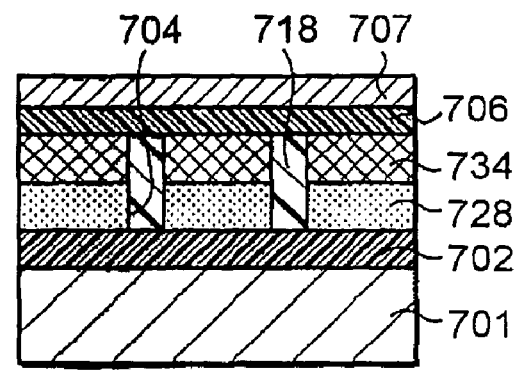
Figure 30C:
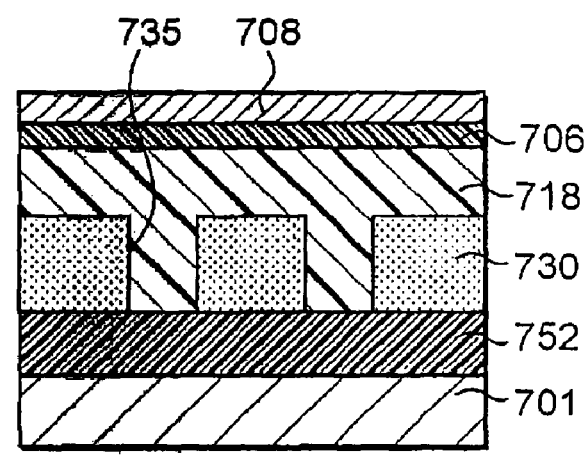

Then, a light shielding metal layer 707 is formed on a portion, excluding the photoelectric conversion elements, of the interlayer insulation film 706 (refer to FIGS. 30A-C). Note that in this case, contact holes, though not shown, are previously formed in the interlayer insulation film 706 and metal interconnect lines 708 made from the light shielding metal layer 707 are formed in the peripheral area while filling the contact holes.

Figure 19A:
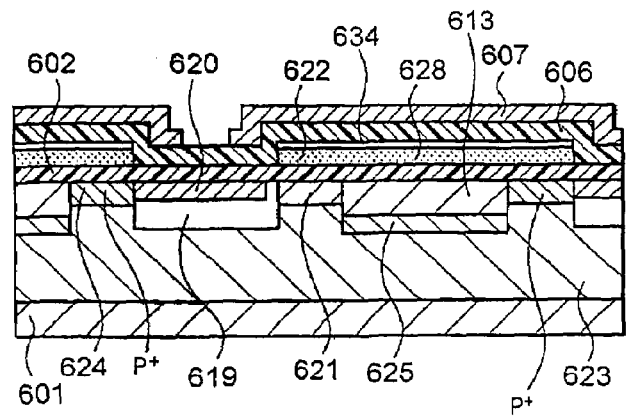
FIG. 19A is a cross sectional view of a solid state image sensor constructed in accordance with a third embodiment of the invention, taken along line I-I (crossing a photoelectric conversion element as a buried photodiode) of FIG. 17.
Figure 19B:
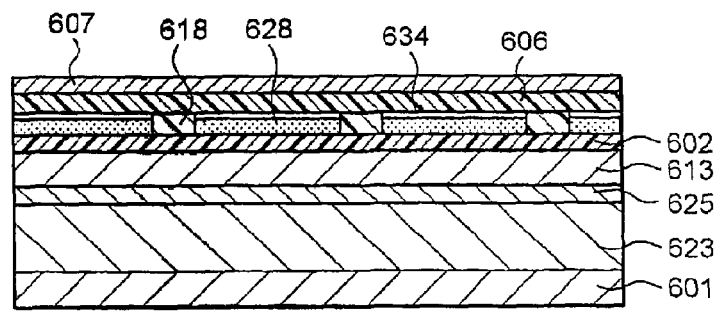
FIG. 19B is a cross sectional view of the solid state image sensor constructed in accordance with the third embodiment of the invention, taken along line II-II (crossing vertical shift register region) of FIG. 17.
Figure 19C:
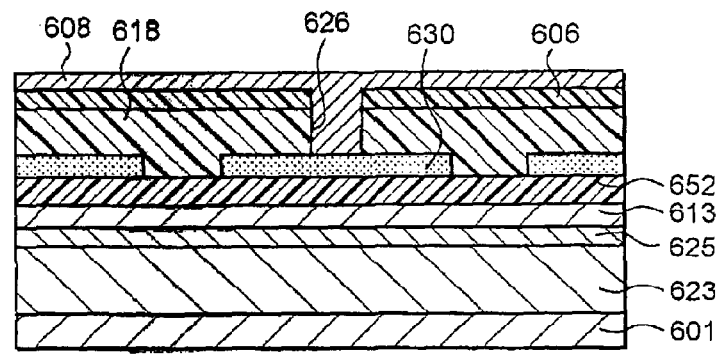
FIG. 19C is a cross sectional view of the solid state image sensor constructed in accordance with the third embodiment of the invention, taken along line III-III (crossing peripheral area) of FIG. 17.

Thus, the solid state image sensor shown in FIGS. 19A-C and constructed in accordance with the third embodiment of the invention is obtained.

In addition to the beneficial effects by employment of the first embodiment, the third embodiment produces beneficial effects because the resistance of shift register electrodes is reduced and therefore, the waveform of charge transfer pulse is not degraded, allowing signal charges to effectively be transferred within the vertical and horizontal shift register channels. Moreover, since the silicided surface portion of the shift register electrodes is formed to transmit small amount of light incident thereon, light transmitting through the light shielding film or light incoming through the opening from a direction inclined relative to the normal to the surface of the substrate is prevented from entering a vertical shift register channel underneath vertical shift register electrodes, thereby allowing the image sensor to reduce smear brightness. Thus, a highly reliable solid state image sensor can be provided.

It should be appreciated that although the case where phosphorous ions and boron ions are implanted from a direction vertical to the surface of the substrate to form an N-well as a photoelectric conversion element and a p.sup.+ region, respectively, is explained in the description of the above-described embodiments, the embodiments may be configured to implant those ions from a direction inclined relative to the normal to the surface of the substrate in order to enable adjustment of a readout voltage used for transfer of signal charges from a photoelectric conversion element to a vertical shift register channel.

As described so far, according to the invention, a single layer of conductive film is patterned through two etching steps. Through the first etching step, a plurality of shift register electrodes are formed and through the second etching step, an opening is formed in each of vertical shift register electrodes on the photoelectric conversion regions. Through the step between the two etching steps, a planarized insulating film is formed over the entire structure. That is, after the first etching step, an insulating film is deposited thick over the entire structure and reflowed to planarize the surface of the insulating film. Then, the insulating film is etched back such that the insulating film in the imaging area is etched back through use of a mask to just fill up the gaps between the vertical/horizontal shift register electrodes and create a planarized surface in the imaging area, and the insulating film in the peripheral area is not etched, i.e., left thick as it is, allowing the entire substrate to be grouped into two planarized regions, i.e., a first planarized region having a small height of planarized surface in the imaging area (i.e., photoelectric conversion regions and vertical/horizontal shift register regions) and a second planarized region having a large height of planarized surface in the peripheral area. This permits a light shielding metal layer to be formed over the entire surface of the substrate without producing discontinuity and reduce smear brightness due to discontinuity in the light shielding metal layer covering shift register channels. Furthermore, the insulating film residing on the peripheral area reduces parasitic capacitance between diffusion layers/electrodes and the metal interconnect lines in the peripheral area, resulting in reduction in device power consumption.

It is apparent that the present invention is not limited to the above embodiments and description, but may be changed or modified without departing from the scopes and spirits of apparatus claims that are indicated in the subsequent pages as well as method claims that are indicated below:

AA. A method for manufacturing a solid state image sensor on a semiconductor substrate having a gate insulating film formed on said substrate in an imaging area and a field isolation dielectric formed on said substrate in a peripheral area, said peripheral area surrounding said imaging area, comprising:
(a) depositing a conductive film over said substrate and patterning said conductive film to form a plurality of shift register electrodes spaced a first distance apart from one another in said imaging area and spaced a second distance, larger than said first distance, apart from one another in said peripheral area;
(b) depositing an insulating film having a thickness larger than that of said conductive film over an entire surface of said substrate so as to cover said plurality of shift register electrodes while completely filling gaps between said plurality of shift register electrodes with said insulating film; and
(c) etching away said insulating film on at least a plurality of shift register electrodes in said imaging area to make a height of said insulating film on said plurality of shift register electrodes in said imaging area nearly equal to a height of said plurality of shift register electrodes.

BB. The method according to claim AA, wherein said plurality of shift register electrodes comprise a plurality of vertical and horizontal shift register electrodes.

CC. The method according to claim AA, wherein said insulating film is an insulating film reflowed by application of heat thereto and wherein the method further comprises between the steps (b) and (c), (d) reforming said insulating film by application of heat thereto to planarize a surface of said insulating film.

DD. The method according to claim AA, further comprising after the step (c), (e) etching away corresponding portions of said plurality of shift register electrodes to form openings for photoelectric conversion elements in said corresponding portions of said plurality of shift register electrodes.

EE. The method according to claim DD, further comprising after the step (e), (f), implanting dopant ions into said substrate through said openings to form photoelectric conversion elements self-aligned to said openings.

FF. The method according to claim EE, wherein in the step (f), an incident angle at which said dopant ions are implanted is adjusted to form said photoelectric conversion element extending inside and below said shift register electrode adjacent said photoelectric conversion element.

GG. The method according to claim EE, further comprising after the step (f), (g), implanting dopant ions into said substrate through said opening to form a cap layer of a conduction type different from that of said photoelectric conversion element in a surface portion of said photoelectric conversion element.

HH. The method according to claim AA, further comprising after the step (c), (h), forming a silicide film in a surface portion of said plurality of shift register electrodes in said imaging area.

II. The method according to claim AA, further comprising after the step (c), (i), forming one of a refractory metal film and a refractory silicide film on an entire surface of said substrate, (j) heating said substrate to form a silicided surface portion of said plurality of shift register electrodes in said imaging area, and (k) removing an unreacted portion of said refractory metal film.

What is claimed is:
1. A solid state image sensor comprising:
a semiconductor substrate having an imaging area and a peripheral area;
a plurality of shift register electrodes formed on said imaging area with a first gap between adjacent ones of said shift register electrodes, each of said shift register electrodes being elongated over said peripheral area, a plurality of peripheral electrodes being thereby formed on said peripheral area with a second gap between adjacent ones of said peripheral electrodes;
a first insulating layer covering said shift register electrodes and filling said first gap, said first insulating layer having a first thickness over an upper surface of each of said shift register electrodes; and
a second insulating layer covering said peripheral electrodes and filling said second gap, said second insulating layer having a second thickness over an upper surface of each of said peripheral electrodes, said second thickness being larger than said first thickness.

2. The solid state image sensor as claimed in claim 1, wherein said first insulating layer includes first and second insulating portions, the first insulating portion filling said first gap to a level of said upper surface of each of said shift register electrodes and said second insulating portion being formed on said first insulating portion and said upper surface of each of said shift register electrodes, and said second insulating layer includes third and fourth insulating portions, said third insulating portion filling said second gap and being extended over said upper surface of each of said peripheral electrodes and said fourth insulating portion being formed on said third insulating portion.

3. The solid state image sensor as claimed in claim 2, wherein said second insulating portion has said first thickness, said third insulating portion having a third thickness over said upper surface of each of said peripheral electrodes, and said fourth insulating portion having said first thickness to thereby cooperate with said third insulating portion to provide said second thickness.

4. The solid state image sensor as claimed in claim 2, wherein said first and third insulating portions include thermally reflowable material.

5. The solid state image sensor as claimed in claim 4, wherein said thermally reflowable material is Boro-Phosphorous-Silicate-Glass (BPSG).

6. The solid state image sensor as claimed in claim 1, wherein a width of said second gap is longer than a width of said first gap.

7. The solid state image sensor as claimed in claim 1, wherein said plurality of shift register electrodes functions as a plurality of vertical and horizontal shift register electrodes, one of said plural shift register electrodes functions as either a vertical shift register electrode or a horizontal shift register electrode.

8. The solid state image sensor as claimed in claim 2, further comprising a plurality of photoelectric conversion elements formed in said imaging area, said second insulating portion extended over said plurality of photoelectric conversion elements, an upper surface of said second insulating portion over each of said plurality of photoelectric conversion elements being lower than said upper surface of each of said plurality of shift register electrodes.

9. The solid state image sensor as claimed in claim 1, further comprising a light shielding metal layer provided on said first and second insulating layer, said light shielding metal layer serving as interconnects for making electrical connection to said plurality of peripheral electrodes.

10. The solid state image sensor as claimed in claim 7, wherein said plurality of vertical and horizontal shift register electrodes is made from a single layer of conductor.

11. The solid state image sensor as claimed in claim 7, wherein each of said vertical and horizontal shift register electrodes has a silicide layer at a surface portion of each of said vertical and horizontal shift register electrodes.

\* \* \* \* \*